US006651501B1

(12) United States Patent
Willis

(10) Patent No.: US 6,651,501 B1
(45) Date of Patent: Nov. 25, 2003

(54) ADAPTIVE EQUALIZER FOR VARIABLE LENGTH SOUND TUBES UTILIZING AN ELECTRICAL IMPEDANCE MEASUREMENT

(75) Inventor: Richard Lance Willis, Lauderhill, FL (US)

(73) Assignee: Motorola, INC, Schaumburg, IL (US)

( * ) Notice: Subject to any disclaimer, the term of this patent is extended or adjusted under 35 U.S.C. 154(b) by 0 days.

(21) Appl. No.: 10/331,281

(22) Filed: Dec. 30, 2002

(51) Int. Cl.[7] ........................... H03G 3/20; G01N 29/00

(52) U.S. Cl. ............................................ 73/589; 381/60

(58) Field of Search .......................... 381/60, 312, 314, 381/320, 93, 94.1; 73/597, 629, 579; 367/101

(56) References Cited

U.S. PATENT DOCUMENTS 5,105,822 A * 4/1992 Stevens et al. ............. 600/559

* cited by examiner

*Primary Examiner*—Thomas P. Noland
*Assistant Examiner*—Tamiko D. Bellamy
(74) *Attorney, Agent, or Firm*—Terri S. Hughes

(57) ABSTRACT

In a device having a sound tube and a receiver, a test signal is generated to apply to the receiver. An electrical impedance of the receiver is measured, and a length of the sound tube is estimated by a shift in frequency of at least one of a maximum and a minimum in the electrical impedance.

16 Claims, 2 Drawing Sheets

ADAPTIVE EQUALIZER FOR VARIABLE LENGTH SOUND TUBES UTILIZING AN ELECTRICAL IMPEDANCE MEASUREMENT

REFERENCE TO RELATED APPLICATIONS

The present application is related to the following U.S. applications commonly owned together with this application by Motorola, Inc.:

Ser. No. 10/331,284, filed Dec. 27, 2002, titled "Adaptive Equalizer for Variable Length Sound Tubes Utilizing an Acoustic Pressure Response Measurement" by Willis (attorney docket no. CM01597L); and Ser. No. 10/331,357, filed Dec. 27, 2002, titled "Adaptive Equalizer for Variable Length Sound Tubes Utilizing an Acoustical Time of Flight Measurement" by Willis (attorney docket no. CM05758LL).

FIELD OF THE INVENTION

The present invention relates generally to an adaptive equalizer for variable length sound tubes utilizing an electrical impedance measurement.

BACKGROUND OF THE INVENTION

Some users of earpiece accessories have a strong preference for certain types of sound delivery systems over others (e.g., an accessory sound delivery tube that terminates in the ear canal versus an intraconcha (inside the bowl of the ear) device). The equalization used to control acoustical standing waves in the earpiece tubing has been shown to have a key role in lowering the threshold of feedback in the earpiece as well as improving the quality of the audio presented to the user. The standing wave frequencies are a function of the combined length of the sound tube and accessory tube; and therefore, the equalization must be tuned to the particular delivery system used. For example, an accessory that terminates near the entrance to the ear canal results in a total tube length different than one that is inserted into the ear canal. This requires a realignment of the equalization in order to maintain feedback suppression and optimum sound quality.

Thus, there exists a need for being able to recognize the length of the accessory sound tube that is connected to the earpiece in order to select the proper settings for the equalizer.

BRIEF DESCRIPTION OF THE FIGURES

A preferred embodiment of the invention is now described, by way of example only, with reference to the accompanying figures in which.

DETAILED DESCRIPTION OF THE PREFERRED EMBODIMENT

Figure 1:
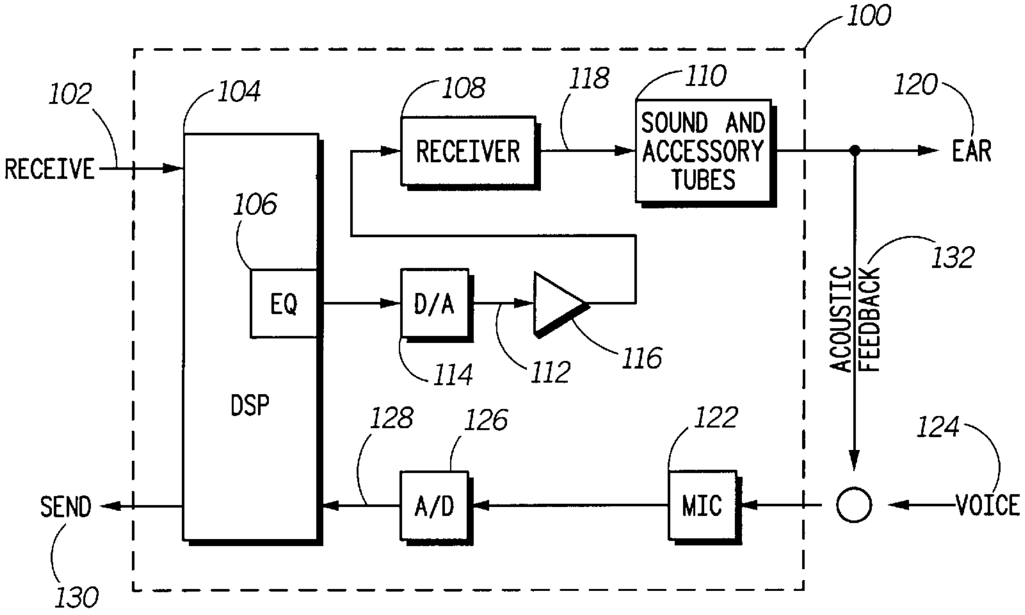
FIG. 1 illustrates a simple block diagram of an earpiece for the acoustic pressure response technique in accordance with the present invention.

It will be appreciated that for simplicity and clarity of illustration, elements shown in the figures have not necessarily been drawn to scale. For example, the dimensions of some of the elements are exaggerated relative to each other. Further, where considered appropriate, reference numerals have been repeated among the figures to indicate identical elements. For clarity, the present invention defines the sound tube as the section of tubing inside the earpiece, and the accessory as the section of interchangeable tubing outside the earpiece.

The present invention proposes a solution for selecting the proper setting for an equalizer (realigning the equalization) based on the length of tubing coupled to a device (e.g., an earpiece). The term "tubing" will refer to the total length of tubing (sound and/or accessory tubes) coupled to the device. Typically, the sound tube is at least partially internal to the device. Thus, the sound tube may have an adjustable length or may have an interchangeable accessory attached thereto. As noted above, realigning the equalization based on the length of tubing maintains feedback suppression and optimizes sound quality. The present invention focuses on three techniques for estimating the total length of tubing coupled to the device: an acoustic pressure response technique, an electrical impedance response technique, and a time of flight measurement technique. Once the total length of tubing is estimated, the present invention is able to select the proper settings for the equalizer.

Figure 2:
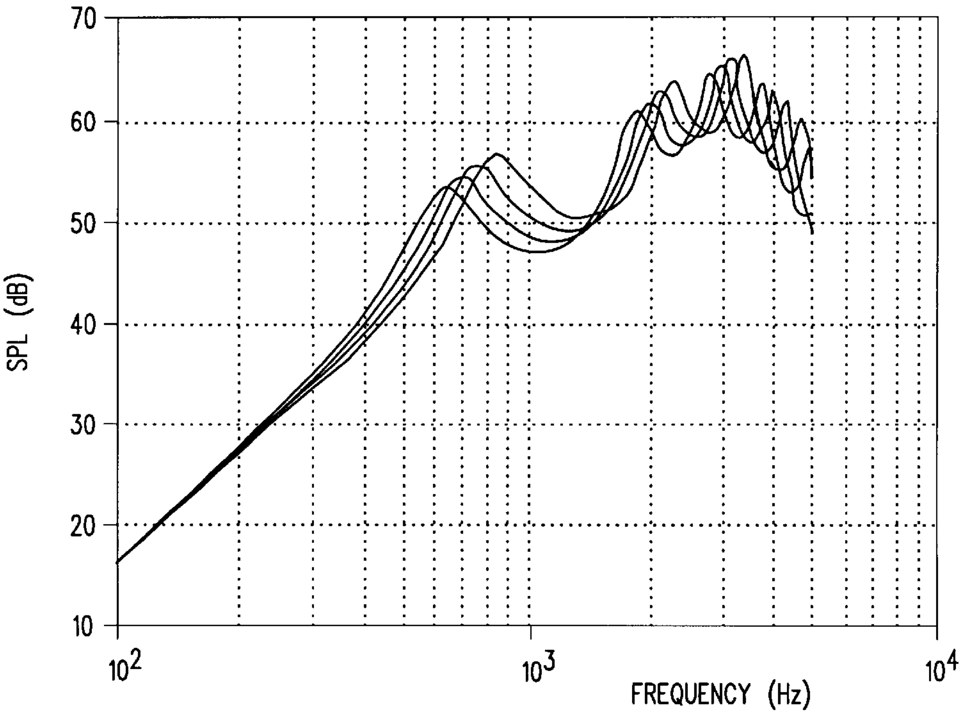
FIG. 2 illustrates a graph of sound pressure level produced by a receiver for various tubing lengths in accordance with the present invention.

Let us first discuss the acoustic pressure response technique. FIG. 1 illustrates an example of a simple block diagram of an earpiece 100. As shown, when a receive audio signal 102 enters the earpiece 100, it is processed by a digital signal processor ("DSP") 104; the DSP 104 comprises an equalizer 106 for equalization of the receive audio signal 102 to compensate for the acoustical response of a receiver 108, sound and/or accessory tubes 110. The receive audio signal 102 is converted into an analog electrical signal 112 by a digital-to-analog ("D/A") converter 114. The analog electrical signal 112 is fed into an amplifier 116, and the output of the amplifier 116 is coupled to the receiver 108. The receiver 108 converts the analog electrical signal 112 to an acoustical output 118. The sound and/or accessory tubes 110 are coupled to the receiver 108 to deliver the acoustical output 118 to the user's ear canal 120. Typical responses of the acoustic pressure delivered to the user's ear canal 120 for varying lengths of tubing (i.e., the combination of both the sound tube and the accessory) 110 are illustrated in FIG. 2.

The send audio path consists of a microphone 122, which picks up the user's voice 124. The output of the microphone 122 is fed into an analog-to-digital ("A/D") converter 126, which sends a digitized signal 128 to the DSP 104. The digitized signal 128 is passed to the send output 130.

Acoustical coupling exists between the receive and send audio paths due to acoustic leakage 132 resulting from sound leaking out of the user's ear 120 and finding its way into the microphone 122. The present invention takes advantage of the acoustic leakage 132 by using the microphone 122 in the earpiece 100 to measure the acoustic pressure response of the sound and/or accessory tubes 110 when a test signal (not shown) is played through the receiver 108. The present invention estimates the total length of the tubing (i.e., the sound tube and/or the accessory) 110 by the frequency of at least one peak in the acoustic pressure response and the sound speed in the tubing 110. The present invention assumes that the sound speed in the tubing 110 is non-dispersive.

In order to estimate the total length of the tubing in accordance with the present invention, a test signal is needed. The test signal may comprise a sequential set of stepped tones. Generation of the test tones can be simplified in the DSP 104 by using square waves close to the highest frequency peak in the acoustic pressure response. Since this peak is near the upper limit of the earpiece passband, the square wave harmonics will fall well outside the passband and be attenuated. The algorithm then steps through a number of frequencies surrounding the peak. From this data, a curve fit of the acoustic pressure response over a limited frequency band surrounding the highest frequency peak can be constructed. The maximum of the curve fit will be at a resonance frequency of the sound tube. This frequency is then used to tune the equalizer response to the attached accessory.

Using the lengths of the sound and/or accessory tubes 110, an equalizer is selected or designed. For example, if a lookup table is used, the length of the sound and/or accessory tubes 110 will identify which accessory has been attached to the earpiece 100. The appropriate equalizer for that accessory can be loaded into the DSP 104 to optimize audio quality and earpiece stability. Alternatively, the lengths of the sound and/or accessory tubes 110 may be used to design an equalizer; preferably, a model of the acoustic pressure response, in which the tubing length is an adjustable parameter, is used to define an inverse equalizer to compensate for the responses for the receiver 108 and sound and/or accessory tubes 110.

Figure 3:
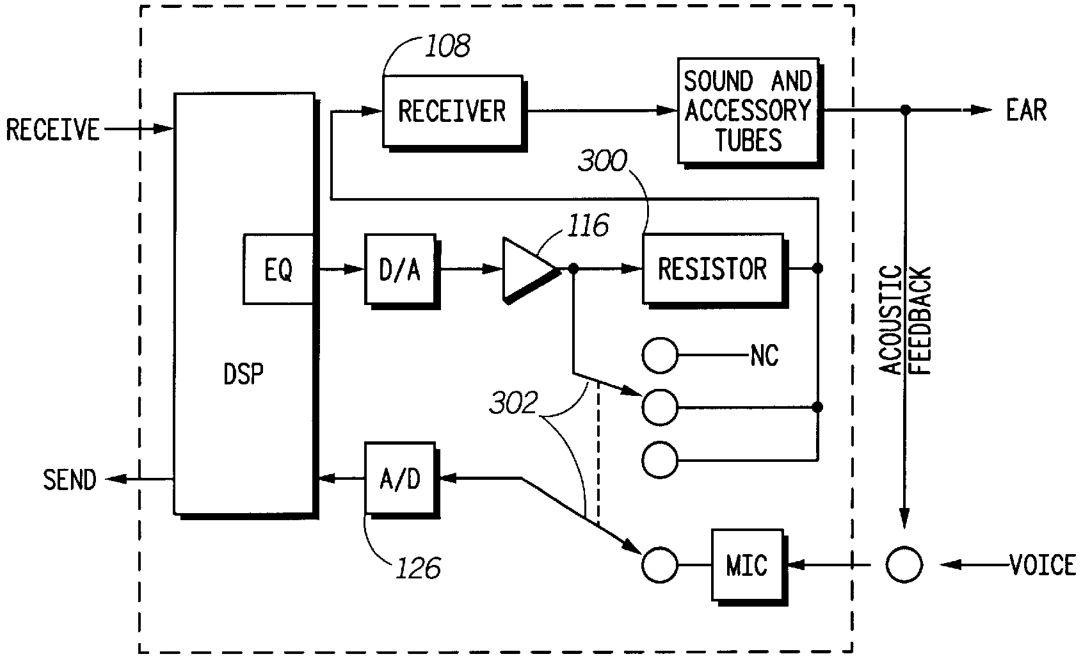
FIG. 3 illustrates a simple block diagram of an earpiece for the electrical impedance and time of flight measurement techniques in accordance with the present invention.

Let us now move the discussion to the electrical impedance response solution in accordance with the present invention. A similar method to the acoustic pressure response technique as described above can be done using the electrical impedance of the receiver. The electrical impedance response of the receiver is strongly influenced by the acoustical loading of the standing waves in the tubing. As illustrated in FIG. 3, measuring the electrical impedance response requires the addition of a resistor 300 in series with the receiver 108, and a double pole, double throw switch 302 to bypass the resistor 300 during normal operation of the earpiece 100 and to select the input to the A/D converter 126 in order to measure the voltage across the receiver 108; alternatively, current could also be measured through the receiver.

Figure 4:
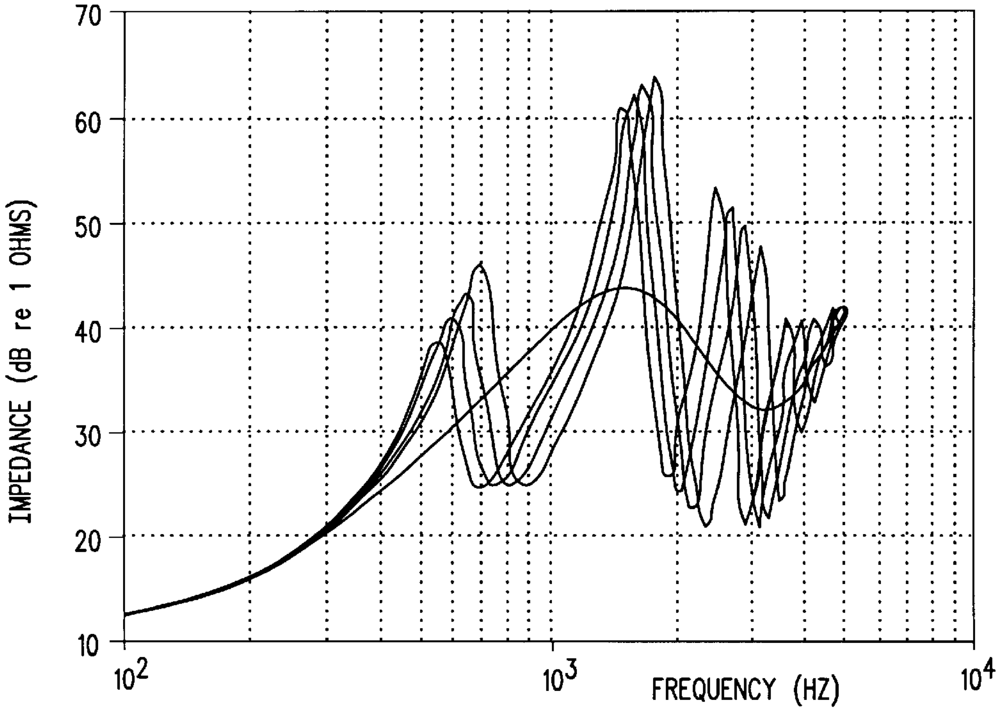
FIG. 4 illustrates a graph of the electrical impedance of a receiver for various tubing lengths in accordance with the present invention.

With the switch 302 in test mode, such that the resistor 300 is not being bypassed and the A/D converter 126 is measuring the voltage across the receiver 108, the voltage measured across the receiver 108 is in proportion to the electrical impedance response. An example of the electrical impedance response of a balanced armature receiver is illustrated in FIG. 4. Although the inductive and capacitive elements in the electro-acoustic model of the receiver prevents the minimums and maximums in the electrical impedance response from coinciding with the standing wave frequencies of the tubing, the minimums and maximums in the electrical impedance response illustrated in FIG. 4 shift in accordance with the standing wave frequencies in FIG. 2. Using the square wave technique described in the acoustic pressure response method, shifts in the resonant frequencies of the tubing can be determined from the electrical impedance response of the receiver. FIG. 4 illustrates that the electrical impedance response is much more sensitive to the standing waves than the acoustic pressure response.

The total length of the sound and/or accessory tubes 110 is estimated by the shift in the frequency of at least one peak in the electrical impedance response. This requires that the tubing length is known a priori for one corresponding peak frequency in the electrical impedance response. Using the length of the sound tube and accessory together, an equalizer is selected or designed as described above.

The third technique, the time of flight measurement, estimates the length of the sound and/or accessory tubing by measuring the time required for an acoustical pulse produced by the receiver 108 to propagate down the length of the tubing, reflect at the open end of the accessory, and return to the receiver 108. The length of the tubing is one half the time of flight to the end of the tubing and back to the receiver multiplied by the speed of sound in the tubing, where the speed of sound is constant over the length of the tubing. A more complicated equation results if the sound speed varies along the length of the tubing.

The hardware configuration required for the time of flight measurement is the same as for the electrical impedance response, however, the receiver 108 is used as both an acoustical source and receiving device. The resistor 300 is necessary in this case to prevent the returning pulse from being shorted out by the low output impedance of the amplifier 116. The acoustical pulse must be shorter than the time required for the pulse to travel down the length of the tubing, reflect at the open end of the accessory, and return to the receiver 108.

In operation, using the time of flight technique, the DSP 106 generates a test pulse. The test pulse exits the D/A converter 114 and goes through the series resistor 300. At this point, the A/D converter 126 detects the outgoing test pulse. The receiver 108, which is in parallel with the A/D converter 126, receives the test pulse at the same time as the A/D converter 126, and generates an acoustic pulse that travels down the length of the tubing, reflects at the open end of the accessory and travels back to the receiver 108. A voltage develops across the series resistor 300 produced by the receiver 108 that now acts as a dynamic microphone. The A/D converter 126 detects the reflected pulse. The difference in time between the outgoing test pulse and its reflection is used to calculate the length of the tubing.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims.

I claim:

1. In a earpiece having a sound tube and a receiver, a method comprising the steps of:

generating a test signal to apply to the receiver;

measuring an electrical impedance of the receiver thereby acting now as a dynamic microphone, receiver; and estimating a length of the sound tube by a shift in frequency of at least one of a maximum or a minimum in the electrical impedance.

2. The method of claim 1 wherein the step of measuring comprises measuring a voltage across the receiver.

3. The method of claim 1 wherein the step of measuring comprises measuring a current through the receiver.

4. The method of claim 1 wherein the sound tube has an adjustable length.

5. The method of claim 1 wherein the sound tube comprises an interchangeable accessory.

6. The method of claim 1 further comprising the step of selecting an equalizer based on the length of the sound tube.

7. The method of claim 6 wherein the equalizer is selected from a lookup table.

8. The method of claim 1 further comprising the step of designing at least a portion of an equalizer based on the length of the sound tube.

9. The method of claim 1 wherein the sound tube is internal to the device.

10. The method of claim 1 wherein the sound tube is external to the device.

11. The method of claim 1 wherein a first portion of the sound tube is internal to the device and a second portion of the sound tube is external to the device.

12. The method of claim 1 wherein the test signal comprises a sequential set of stepped tones.

13. The method of claim 1 wherein the step of generating a test signal comprises using square waves close to a frequency corresponding to the maximum or the minimum in the electrical impedance.

14. The method of claim 13 further comprising stepping through a number of frequencies surrounding the maximum or the minimum in the electrical impedance.

15. The method of claim 14 further comprising constructing a curve fit of the electrical impedance over a limited frequency band surrounding the maximum or the minimum in the electrical impedance.

16. The method of claim 1 wherein the test signal is played through the receiver.

* * * * *

UNITED STATES PATENT AND TRADEMARK OFFICE

CERTIFICATE OF CORRECTION

PATENT NO. : 6,651,501 B1
DATED : November 25, 2003
INVENTOR(S) : Willis, Richard Lance et al.

It is certified that error appears in the above-identified patent and that said Letters Patent is hereby corrected as shown below:

<u>Column 4,</u>
Line 5, after "microphone," delete "receiver".

Signed and Sealed this

Twenty-eighth Day of September, 2004

JON W. DUDAS
*Director of the United States Patent and Trademark Office*